United States Patent
Wen et al.

(10) Patent No.: US 10,573,713 B2
(45) Date of Patent: Feb. 25, 2020

(54) HIGH VOLTAGE JUNCTION TERMINATING STRUCTURE OF HIGH VOLTAGE INTEGRATED CIRCUIT

(71) Applicant: Nuvoton Technology Corporation, Hsinchu (TW)

(72) Inventors: Wen-Ying Wen, Hsinchu (TW); MD Imran Siddiqui, Hsinchu (TW); Yu-Chi Chang, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 0 days.

(21) Appl. No.: 15/856,096

(22) Filed: Dec. 28, 2017

(65) Prior Publication Data

US 2018/0190766 A1 Jul. 5, 2018

(30) Foreign Application Priority Data

Dec. 29, 2016 (TW) .............................. 105143851 A

(51) Int. Cl.
*H01L 21/761* (2006.01)
*H01L 29/06* (2006.01)
(Continued)

(52) U.S. Cl.
CPC ........ *H01L 29/0646* (2013.01); *H01L 21/761* (2013.01); *H01L 27/0629* (2013.01);
(Continued)

(58) Field of Classification Search
CPC ............... H01L 29/0646; H01L 21/761; H01L 27/0629; H01L 29/1095; H01L 29/1008;
(Continued)

(56) References Cited

U.S. PATENT DOCUMENTS 4,980,744 A * 12/1990 Watanabe ........... H01L 21/8249
257/370
5,899,714 A * 5/1999 Farrenkopf ........... H01L 21/761
148/DIG. 85
(Continued)

FOREIGN PATENT DOCUMENTS

| TW | 200711122 | 3/2007 |
| WO | 2012124677 | 9/2012 |

OTHER PUBLICATIONS

Jing Zhu et al., "An Integrated Bootstrap Diode Emulator for 600-V High Voltage Gate Driver IC With P-Sub/P-Epi Technology", IEEE Transactions on Power Electronics, Jan. 2016, pp. 518-523.
(Continued)

*Primary Examiner* — Bitew A Dinke
(74) *Attorney, Agent, or Firm* — JCIPRNET

(57) ABSTRACT

A HVJT structure of HVIC includes P-type substrate. Epitaxial layer is formed on the substrate. N-type doped structure is formed in the epitaxial layer, contacting with the substrate. P-type doped structure is in the N-type doped structure connecting with anode. The substrate, the N-type doped structure and the P-type doped structure form a PNP path along a perpendicular direction to the substrate, wherein NP provide bootstrap diode function and surround the high-side circuit at a horizontal direction. N-type cathode structure is in the epitaxial layer. N-type epitaxial doped region contacts with the substrate, between the PNP path and the N-type cathode structure, also surrounding the high-side circuit. Gate structure is over the N-type epitaxial doped region, between the P-type doped structure and N-type cathode structure. P-type base doped structure is in the epitaxial layer adjacent to the N-type doped structure, to provide a substrate voltage to the substrate.

10 Claims, 6 Drawing Sheets

(51) Int. Cl.
   *H01L 29/10* (2006.01)
   *H01L 27/06* (2006.01)
   *H01L 29/861* (2006.01)
   *H01L 29/739* (2006.01)
   *H01L 29/78* (2006.01)

(52) U.S. Cl.
   CPC ...... *H01L 29/0642* (2013.01); *H01L 29/0688* (2013.01); *H01L 29/1008* (2013.01); *H01L 29/1095* (2013.01); *H01L 29/7393* (2013.01); *H01L 29/7823* (2013.01); *H01L 29/861* (2013.01)

(58) Field of Classification Search
   CPC ............. H01L 29/0688; H01L 29/0642; H01L 29/861; H01L 29/7823; H01L 29/7393
   See application file for complete search history.

(56) References Cited

U.S. PATENT DOCUMENTS

| | | | | |
|---|---|---|---|---|
| 5,973,368 | A * | 10/1999 | Pearce | H01L 21/8234 257/329 |
| 7,544,558 | B2 * | 6/2009 | Ren | H01L 21/823412 257/E21.418 |
| 8,957,475 | B2 | 2/2015 | Moon | |
| 9,397,205 | B1 * | 7/2016 | Tsai | H01L 29/7393 |
| 9,887,187 | B2 * | 2/2018 | Fujie | H01L 29/0646 |
| 10,020,392 | B2 * | 7/2018 | Ningaraju | H01L 29/7835 |
| 2006/0118881 | A1 * | 6/2006 | Ren | H01L 21/8249 257/370 |
| 2006/0157818 | A1 * | 7/2006 | Williams | H01L 21/26513 257/511 |
| 2006/0220099 | A1 * | 10/2006 | Kikuchi | H01L 29/402 257/315 |
| 2008/0150083 | A1 * | 6/2008 | Soma | H01L 29/6625 257/587 |
| 2008/0191315 | A1 * | 8/2008 | Soma | H01L 29/66272 257/565 |
| 2009/0243696 | A1 * | 10/2009 | Jeon | H01L 21/823481 327/333 |
| 2012/0267750 | A1 * | 10/2012 | Imai | H01L 27/0248 257/495 |
| 2013/0127524 | A1 | 5/2013 | Yamaji | |
| 2013/0341718 | A1 * | 12/2013 | Kim | H01L 29/402 257/342 |
| 2014/0210003 | A1 * | 7/2014 | Ko | H01L 27/0629 257/337 |
| 2015/0014783 | A1 * | 1/2015 | Imai | H01L 21/823878 257/372 |
| 2015/0021711 | A1 * | 1/2015 | Jonishi | H01L 27/0285 257/401 |
| 2015/0023082 | A1 * | 1/2015 | Yamaji | H01J 27/088 363/131 |
| 2015/0048449 | A1 * | 2/2015 | Jeon | H01L 29/7816 257/337 |
| 2015/0364470 | A1 | 12/2015 | Yamaji | |
| 2015/0380400 | A1 * | 12/2015 | Jonishi | H01L 21/823878 257/369 |
| 2016/0006427 | A1 * | 1/2016 | Jonishi | H01L 21/823493 327/109 |
| 2016/0043067 | A1 * | 2/2016 | Yamaji | H01L 21/761 257/357 |
| 2016/0043180 | A1 * | 2/2016 | Chang | H01L 29/0615 257/112 |
| 2016/0056148 | A1 * | 2/2016 | Kanno | H01L 29/7395 257/139 |
| 2016/0056282 | A1 | 2/2016 | Yamaji | |
| 2016/0065208 | A1 * | 3/2016 | Moriya | H03K 17/6871 318/696 |
| 2016/0240660 | A1 * | 8/2016 | Yue | H01L 29/7816 |
| 2016/0365410 | A1 * | 12/2016 | Chang | H01L 29/7816 |
| 2018/0069116 | A1 * | 3/2018 | Ningaraju | H01L 29/7835 |
| 2018/0331102 | A1 * | 11/2018 | Kanno | H01L 27/0921 |

OTHER PUBLICATIONS

"Office Action of Taiwan Counterpart Application", dated Mar. 16, 2018, p. 1-p. 4, in which the listed references were cited.

* cited by examiner

US 10,573,713 B2

HIGH VOLTAGE JUNCTION TERMINATING STRUCTURE OF HIGH VOLTAGE INTEGRATED CIRCUIT

CROSS-REFERENCE TO RELATED APPLICATION

This application claims the priority benefit of Taiwan application serial no. 105143851, filed on Dec. 29, 2016. The entirety of the above-mentioned patent application is hereby incorporated by reference herein and made a part of this specification.

BACKGROUND

1. Field of the Invention

The present invention generally relates to semiconductor integrated circuit, in particular, to a high voltage junction terminating (HVJT) structure of a high-voltage integrated circuit (HVIC).

2. Description of Related Art

It has been more and more concerned to improve the power efficiency. The off-line power converter capable of reducing the power consumption is also becoming increasingly important. In response to market changing, the HVIC chip with better performance and satisfying the economic benefits has been gradually taken, so the designer can achieve flexible solutions when implementing high-performance power converter.

An example for the effect of the HVIC chip is gate driver, so to drive the metal-oxide-semiconductor field-effect transistor (MOSFET) or insulated gate bipolar transistor (IGBT), in which bootstrap diode, capacitor and resistor are usually used to form a bootstrap circuit. Taking a floating voltage level of the source voltage (Vs) of the MOSFET belonging to the high-side circuit as the base, a voltage level of the HVIC can be provided.

The HVIC chip further includes a low-side circuit, operated at low voltage for the low voltage circuit. Therefore, a level shifter is further included between the high-side circuit and the low-side circuit. Since the high-side circuit is operated at high voltage, which can be 600V in operation as an example, the periphery of the high-side circuit further includes HVJT structure, so to prevent the voltage of the high-side circuit from being punching through, resulting in a damage of the low voltage circuit.

The HVIC chip with HVJT structure usually includes a bootstrap circuit and the HVJT structure. How to simplify the structure of the HVIC chip is also one the issues to be considered by the designers.

SUMMARY OF THE INVENTION

The present invention provides a HVJT structure of a HVIC chip, capable of integrating the bootstrap circuit into the HVJT structure, so as simplify the circuit structure.

According to an embodiment of the invention for the HVJT structure, it is suitable for use in a HVIC, wherein the HVIC includes a high-side circuit, a low-side circuit, and a level shifter connected between the high-side circuit and the low-side circuit for shifting power level. The HVJT structure comprises a substrate of a P conductive type. An epitaxial layer is disposed on the substrate. An N-type doped structure is disposed in the epitaxial layer, contacting with the substrate. A P-type doped structure is disposed on the N-type doped structure, connecting with an anode. The substrate, the N-type doped structure and the P-type doped structure form a PNP path along a perpendicular direction to the substrate, wherein the N-type doped structure and the P-type doped structure provide a bootstrap diode and surround the high-side circuit at a horizontal direction. An N-type cathode structure is disposed in the epitaxial layer, contacting with a cathode. An N-type epitaxial doped region is disposed in the epitaxial layer, contacting with the substrate between the PNP path and the N-type cathode structure, and surrounding the high-side circuit. A gate structure is disposed over the N-type epitaxial doped region, between the P-type doped structure and the N-type cathode structure. A P-type base doped structure is disposed in the epitaxial layer adjacent to the N-type doped structure, to provide a substrate voltage to the substrate. A structure of the PNP path comprises: a first N-type high voltage well region, in the epitaxial layer and contacting with the substrate; a P-type well region, in the first N-type high voltage well region, wherein the first N-type high voltage well region surrounds sidewalls of the P-type well region, wherein a first sidewall of the first N-type high voltage well region under the gate structure abuts to the N-type epitaxial doped region and a second sidewall of the first N-type high voltage well region directly contacts with the P-type doped well containing the P-type base doped structure; and a P-type contact region, in the P-type well region, to connect with the anode.

In an embodiment of the invention, a structure of the PNP path comprises a first N-type high voltage well region, in the epitaxial layer and contacting with the substrate. A P-type well region is in the first N-type high voltage well region. A P-type contact region is in the P-type well region, to connect with the anode.

In an embodiment of the invention, a bottom of the first N-type high voltage well region further comprises N-type buried layer in contacting with the substrate but having a distance from the P-type base doped structure.

In an embodiment of the invention, the N-type cathode structure comprises a first N-type doped region in the N-type epitaxial doped region, without contacting with the substrate. A second N-type doped region is in the first N-type doped region. An N-type contact region is in the second N-type doped region, to connect with the cathode.

In an embodiment of the invention, the N-type cathode structure comprises a second N-type high voltage well region in the N-type epitaxial doped region and contacting with the substrate. A first N-type doped region is in the second N-type high voltage well region, without contacting with the substrate. The second N-type doped region is in the first N-type doped region. The N-type contact region is on the second N-type doped region, to connect with the cathode.

In an embodiment of the invention, the substrate also has a P-type buried layer formed thereon. A structure of the PNP path comprises a first N-type high voltage well region, in the epitaxial layer and contacting with the substrate and the P-type buried layer. A P-type well region is in the first N-type high voltage well region. A P-type contact region is in the P-type well region to contact with the anode.

In an embodiment of the invention, the N-type cathode structure comprises a first N-type doped region in the N-type epitaxial doped region, without contacting with the substrate. A second N-type doped region is in the first N-type doped region. An N-type contact region is in the second N-type doped region, to connect with the cathode.

In an embodiment of the invention, the N-type cathode structure comprises a second N-type high voltage well region in the N-type epitaxial doped region and contacting with the substrate. A first N-type doped region is in the second N-type high voltage well region, without contacting with the substrate. The second N-type doped region is in the first N-type doped region. The N-type contact region is on the second N-type doped region, to connect with the cathode.

In an embodiment of the invention, a structure of the PNP path comprises an N-type buried layer, disposed in the substrate at surface. A P-type high voltage well region is in the epitaxial layer and contacting with the N-type buried layer. A P-type contact region is in the P-type high voltage well region, to connect with the anode. A first N-type high voltage well region is in the epitaxial layer adjacent to the P-type high voltage well region and contacting with the N-type buried layer, wherein the first N-type high voltage well region is between the P-type high voltage well region and the P-type base doped structure.

In an embodiment of the invention, the substrate also has a P-type buried layer thereon adjacent to the N-type buried layer.

In an embodiment of the invention, the HVJT structure further comprises multiple isolation structures at surface of the epitaxial layer, to isolate the P-type doped structure, the N-type cathode structure, the P-type base doped structure and the gate structure.

In an embodiment of the invention, the P-type base doped structure comprises a P-type buried layer, disposed in the substrate at surface. A P-type high voltage well region is adjacent to a structure of the PNP path. A P-type doped region is in the P-type high voltage well region, to receive the substrate voltage.

In an embodiment of the invention, a voltage of the anode varies with an operation state.

According to an embodiment of the invention, a high voltage integrated circuit is implemented on a substrate of a P conductive type. The high voltage integrated circuit has a high-side circuit, a low-side circuit, and a level shifter connected between the high-side circuit and the low-side circuit for shifting power level. The high voltage integrated circuit comprises a high voltage junction terminating structure, surrounding the high-side circuit, wherein the high voltage junction terminating structure has an anode. From the anode to the substrate along a direction perpendicular to the substrate, a PNP doped structure is comprised. A structure of the PNP path comprises: a first N-type high voltage well region, in the epitaxial layer and contacting with the substrate; a P-type well region, in the first N-type high voltage well region, wherein the first N-type high voltage well region surrounds sidewalls of the P-type well region, wherein a first sidewall of the first N-type high voltage well region abuts to an N-type doped portion of the epitaxial layer and a second sidewall of the first N-type high voltage well region directly contacts with a P-type doped portion of the epitaxial layer, wherein a P-type base doped structure is disposed in the P-type doped portion of the epitaxial layer; and a P-type contact region, in the P-type well region, to connect with the anode.

As to the foregoing descriptions, the invention builds up a PNP path in the HVJT structure from the P-type doped structure for connection to the anode to the substrate. Through the P-type anode and the N-type structure as added over the P-type substrate, the structure integrated with the bootstrap diode function can be achieved.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The invention has looked into the HVIC structure and proposed the HVJT structure thereof to integrate the bootstrap diode, and then the HVIC structure can be simplified. The bootstrap diode also does not occupy the available circuit area.

Figure 1:
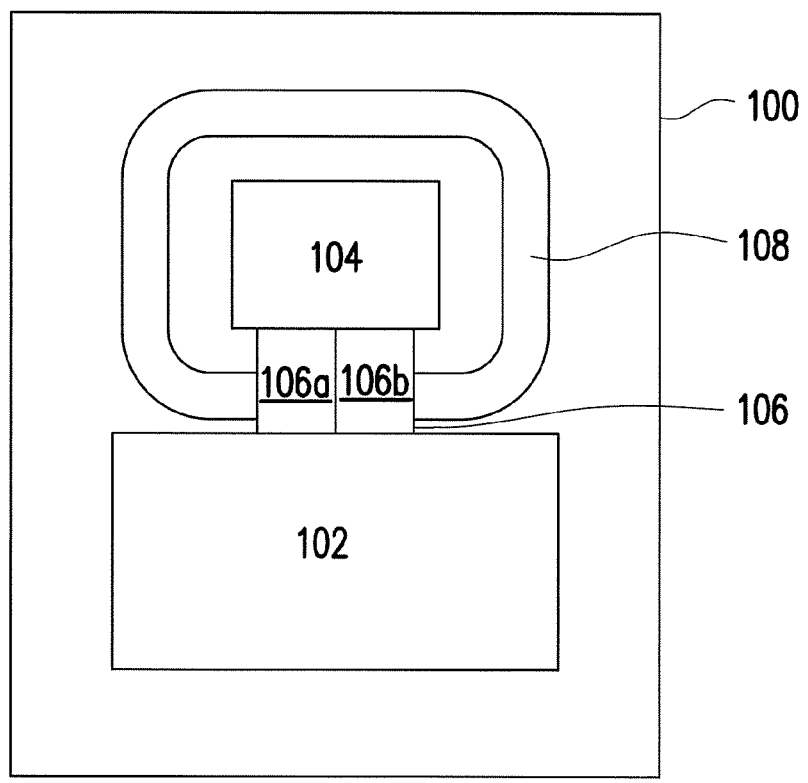
FIG. 1 is a drawing, schematically illustrating a high voltage integrated circuit, according to an embodiment of the invention.

FIG. 1 is a drawing, schematically illustrating a high voltage integrated circuit, according to an embodiment of the invention. Referring to FIG. 1, the HVIC 100 in an example includes a low-side circuit 102 operated at low voltage, a high-side circuit 104 operated at high voltage, and a level shifter 106 connected between the low-side circuit 102 and the high-side circuit 104, to shift the voltage level in response to the operation of the low-side circuit 102 and the high-side circuit 104. In this manner, the level shifter 106 in an example can include a set shifter 106a and a reset shifter 106b. Since the high-side circuit 104 is dynamically operated at high voltage, such as the operation voltage of 600V or even higher, the periphery of the high-side circuit 104 has a circuit with HVJT structure 108 based on semi-conductor structure, so as to prevent the voltage in the high-side circuit 104 from transmitting out and entering the low-side circuit 102, resulting in damage.

Further, since the high-side circuit 104 needs charging action to achieve the high voltage as needed, it needs bootstrap circuit to help the charging and discharging actions. The invention is directed to the bootstrap diode in the bootstrap circuit, so to integrate the bootstrap diode into the HVJT structure 108. The bootstrap diode need not to additionally occupy the available circuit area. As the operation of the HVIC 100, it can be understood by the one with ordinary skill in the art about the basic operation mechanism. The further descriptions are omitted. The following descriptions are related to how to integrate the bootstrap diode into the HVJT structure 108 based on the semiconductor structure.

Figure 2:
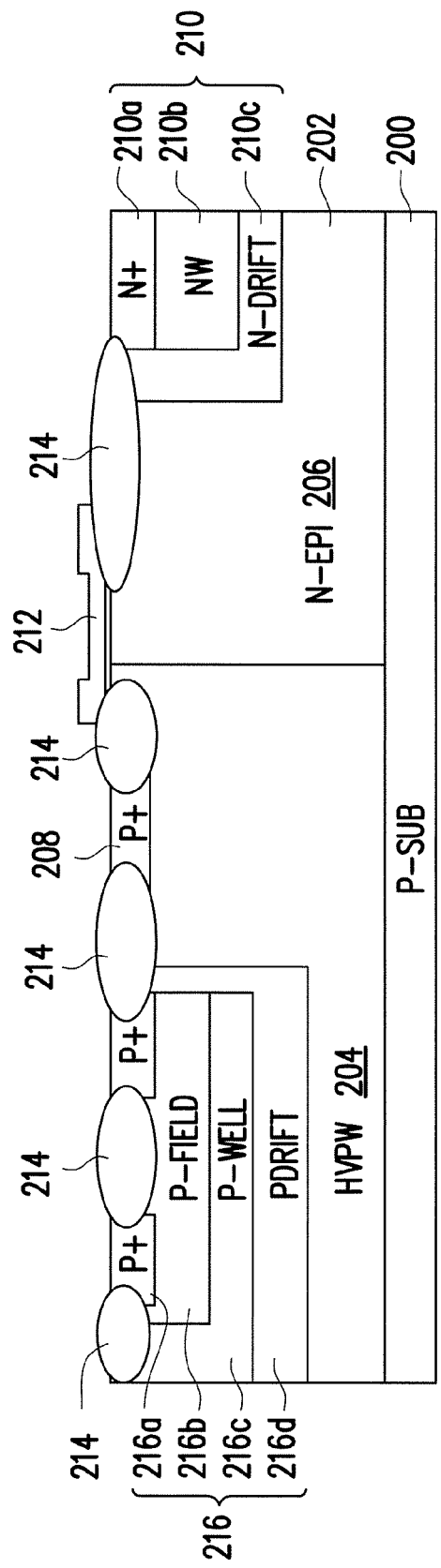
FIG. 2 is a drawing, schematically illustrating a cross-sectional structure of a HVJT structure, according to an embodiment of the invention.

FIG. 2 is a drawing, schematically illustrating a cross-sectional structure of a HVJT structure, according to an embodiment of the invention. Referring to FIG. 2, the invention has looked into the HVJT structure without integration with the bootstrap diode, so that the HVJT structure integrated with the bootstrap diode can be developed out. The HVJT structure is formed on s substrate 200 of P conductive type (P-SUB), which is taken as the structure base. An epitaxial layer 202 is firstly formed on the substrate 200. A plurality of isolation structures is formed on the epitaxial layer 202 at the surface part, to serve as the isolations between devices. The basic structure of HVJT structure is a MOS structure, including source terminal corresponding to the location indicated by 208, a gate terminal corresponding to the location indicated by 212, and a drain terminal corresponding to the location indicated by 210.

As to the semiconductor structure, the doping processes can be used in the epitaxial layer 202 to have the doped structures as needed. The foregoing HVJT structure, not yet integrated with the bootstrap diode, includes the N-type epitaxial doped region (N-EPI) 206, which contacts with the substrate 200. The gate structure 212 is disposed over the N-type epitaxial doped region (N-EPI) 206 and isolated by the isolation structure 214. The structure of the N-type epitaxial doped region (N-EPI) 206 corresponding to FIG. 1 is surrounding the high-side circuit 104 and controlled by the gate structure 212 to have the effect to terminate the high voltage.

The adjacent region to the N-type epitaxial doped region (N-EPI) 206 in the epitaxial layer 202 would be doped by P-type impurity to form a P-type high voltage well region (HVPW) 204. The doped structure serving as the source terminal used to connect to the anode is described first. It is formed including a P-type contact region (P+) 208 and a P-type doped well region (IPW) 218. The "P+" here represents that it can be a P-type heavily doped region. So far, the structure in FIG. 2 is a basic structure of HVJT, as the HVJT structure not yet integrated with the bootstrap diode. In accordance with the intension to integrate with the bootstrap diode, as to be described later in FIG. 3, the HVJT structure in FIG. 2 can be taken as the base, and an N-type high voltage well region (HVNW) 220 can be added, so a P-type doped well region (IPW, Isolated P-Well) 218 can be further formed in the N-type high voltage well region (HVNW) 220. The P-type contact region (P+) 208 is formed in the P-type doped well region (IPW, Isolated P-Well) 218, to receive the anode voltage. The descriptions in detail would be further described in FIG. 3. The anode voltage, such as the system low voltage Vcc, is varying within a range such as 0V to 25V, in according with the need of the operations of the high-side circuit and the low-side circuit. Here, if just for the HVJT use, it just needs to connect the P-type contact region (P+) 208 and the P-type high voltage well region (HVPW) 204 in FIG. 2. The P-type doped well region (IPW) 218 is not necessary to be additionally formed.

Further, the N-type cathode structure 210, serving as the drain terminal for connecting with the cathode, is formed in the epitaxial layer 202, and is located within the N-type epitaxial doped region (N-EPI) 206. It in an example includes N-type doped region 210c in the N-type epitaxial doped region (N-EPI) 206, referred as the N-DRIFT region. The N-type doped region 210c can further include the N-type doped well region 210b and the N-type contact region (N+) 210a on the N-type doped well region 210b for connection to the cathode. An isolation structure 214 is between the gate structure 212 and the N-type doped region 210c for electrical isolation. The impurity concentration of the N-type cathode structure 210 is gradually decreasing in steps, for example, starting from the N-type contact region (N+) 210a and ending to the substrate 200 with connection. The "N+" here represents that it can be N-type heavily doped region. However, the N-type cathode structure 210 is not just limited to the foregoing structure, it has been sufficient to be able to receive the cathode voltage.

Furthermore, the P-type base doped structure 216, used to provide the substrate voltage to the substrate 200, is formed in the P-type high voltage well region (HVPW) 204. In an example, it is composed of multiple doped regions in different layer for different effects, as indicated by P+ doped region 216a, P-FIELD doped region 216b, P-WELL doped region 216c, and PDRIFT doped region 216d in an example. The impurity concentration is gradually changing and reaches to the substrate 200. The P+ doped region 216a serves as the P-type contact region, being P-type doped region in high concentration and receiving the substrate voltage for providing to the substrate 200. However, the P-type base doped structure 216 is not just limited to the foregoing embodiment. It has been sufficient to receive the substrate voltage for providing to the substrate 200.

FIG. 2 is a HVJT structure not yet integrated with the bootstrap diode. The invention looks into the HVJT structure as a base and proposes that the bootstrap diode can be integrated, in which a PNP path can be formed from the P-type contact region (P+) 208 to the substrate 200, the bootstrap diode is then integrated therein.

Figure 3:
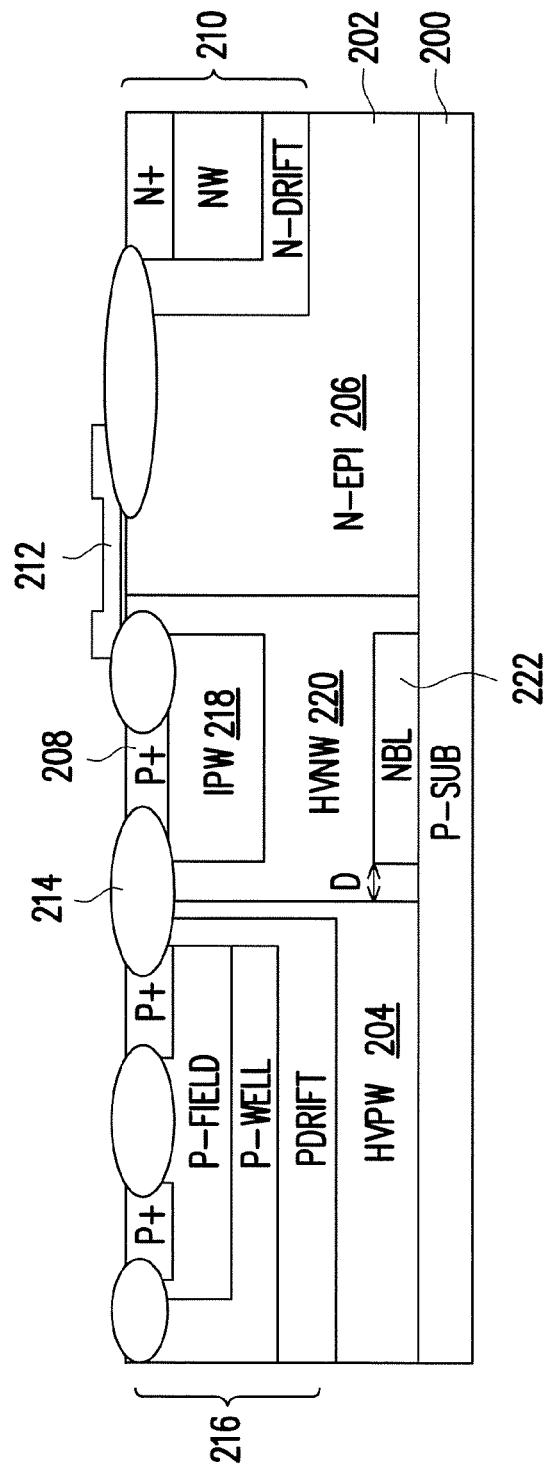
FIG. 3 is a drawing, schematically illustrating a cross-sectional structure of a HVJT structure, according to an embodiment of the invention.

FIG. 3 is a drawing, schematically illustrating a cross-sectional structure of a HVJT structure, according to an embodiment of the invention. Referring to FIG. 3, the embodiment is a HVJT structure based on FIG. 2 and further integrates with the bootstrap diode. The structure of FIG. 2 is taken as the base structure in this embodiment, the same reference numerals represent the similar device elements. However, the doped structure has been modified in accordance with the structure for the bootstrap diode.

First, an N-type doped structure corresponding to location of the P-type contact region (P+) 208 is formed in the epitaxial layer 202, including the N-type high voltage well region (HVNW) 220 and contacts to the substrate 200. The N-type high voltage well region (HVNW) 220 takes the place of a part of the P-type high voltage well region (HVPW) 204 in FIG. 2 and adjacent to each other. The formation of the N-type high voltage well region (HVNW) 220 causes the formation of the bootstrap diode as embedded. In addition, the N-typ doped structure can also further include an N-type buried layer (NBL) 222 at the bottom part, in contact with the substrate 200, so to improve the capability for preventing from breakdown. The N-type buried layer (NBL) 222 in an example has a distance D from the P-type high voltage well region (HVPW) 204, such as 8 microns. However, the N-type buried layer (NBL) 222 is not absolutely needed.

Further, the P-type contact region (P+) 208 and the P-type doped well region (IPW) 218 are formed on the N-type doped structure, that is, formed in the N-type high voltage well region (HVNW) 220, wherein the P-type contact region (P+) 208 is used to connect to the anode and formed in the P-type doped well region (IPW) 218. As a result, the substrate 200, the N-type doped structure (e.g. including the N-type high voltage well region (HVNW) 220 and the N-type buried layer (NBL) 222) and the P-type doped structure (e.g. including the P-type contact region (P+) 208 and the P-type doped well region (IPW) 218) form a PNP path along a direction perpendicular to the substrate 200, so to provide a bootstrap diode in the path. In addition, as shown in FIG. 1, the structure of PNP path at the horizontal direction is surrounding the high-side circuit 104.

In addition to the structure of the foregoing PNP path to provide the bootstrap diode, the other structure such as the N-type cathode structure 210, as described in FIG. 2, is also formed in the epitaxial layer 202, for connection to cathode. The N-type epitaxial doped region (N-EPI) 206 in the epitaxial layer 202 contacts with the substrate 200 and is located between the PNP path and the N-type cathode structure 210, also surrounding the high-side circuit. The gate structure 212 is over the N-type epitaxial doped region (N-EPI) 206 and located between the P-type doped structure (208+218) and the N-type cathode structure 210. The P-type base doped structure 216 in the epitaxial layer 202 with the P-type high voltage well region (HVPW) 204 is used to provide the substrate voltage to the substrate 200.

Here, the P-type base doped structure 216 is not limited to doped structure as proved in the foregoing embodiment. It has been sufficient to be able to receive the substrate voltage and transmit the voltage to the substrate 200, and maintain the structure without damage by the high voltage.

Figure 4:
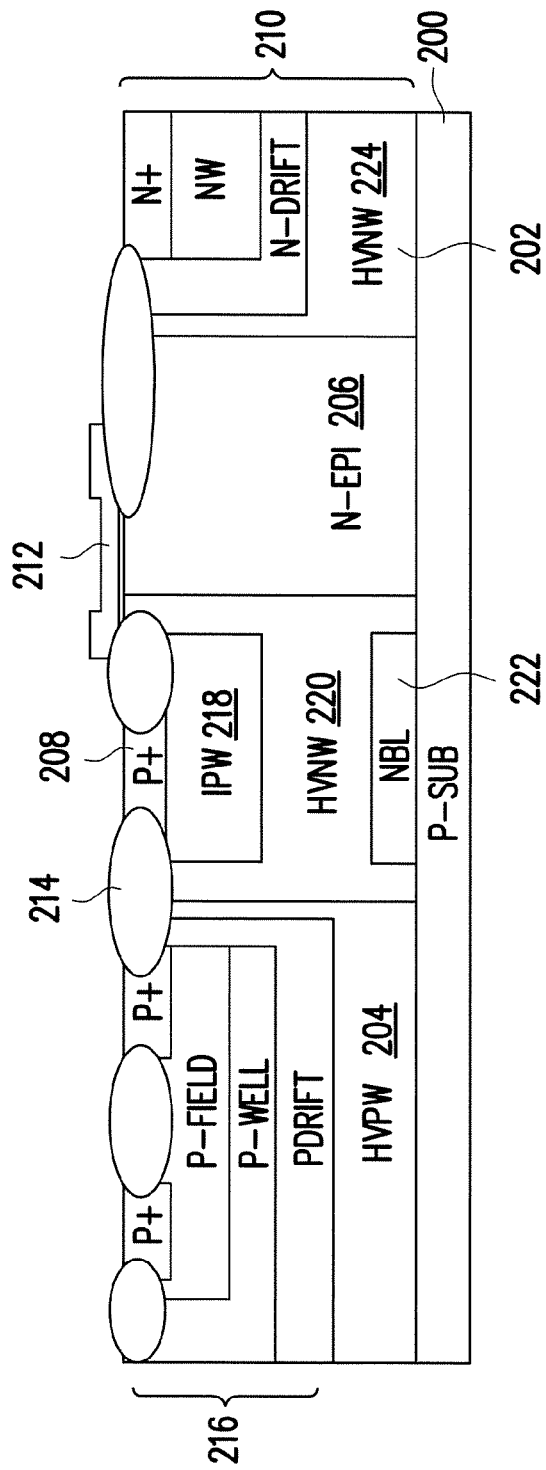
FIG. 4 is a drawing, schematically illustrating a cross-sectional structure of a HVJT structure, according to an embodiment of the invention.

Based on the mechanism shown in FIG. 3 for the HVJT structure integrated with the bootstrap diode, it can be applied to the HVJT structure in different type. FIG. 4 is a drawing, schematically illustrating a cross-sectional structure of a HVJT structure, according to an embodiment of the invention. Referring to FIG. 4, taking the structure of FIG. 3 as the base to modify the N-type cathode structure 210, another N-type high voltage well region (HVNW) 224 is added, formed in the epitaxial layer 202 and adjacent to the N-type epitaxial doped region (N-EPI) 206. The N-type high voltage well region (HVNW) 224 contacts with the substrate 200. In addition, multiple doped regions of N-DRIFT, NW and N+ are sequentially formed in the N-type high voltage well region (HVNW) 224. As a result, the N-type cathode structure 210 serves as the drain terminal to receive the cathode voltage.

As understandably, either the N-type cathode structure 210 in FIG. 3 or FIG. 4 is taken, the PNP path for integrating the bootstrap diode is not changed. In other words, although the N-type cathode structure 210 of the invention is described in multiple embodiments, the N-type cathode structure 210 is not limited to the provided embodiments.

Figure 5:
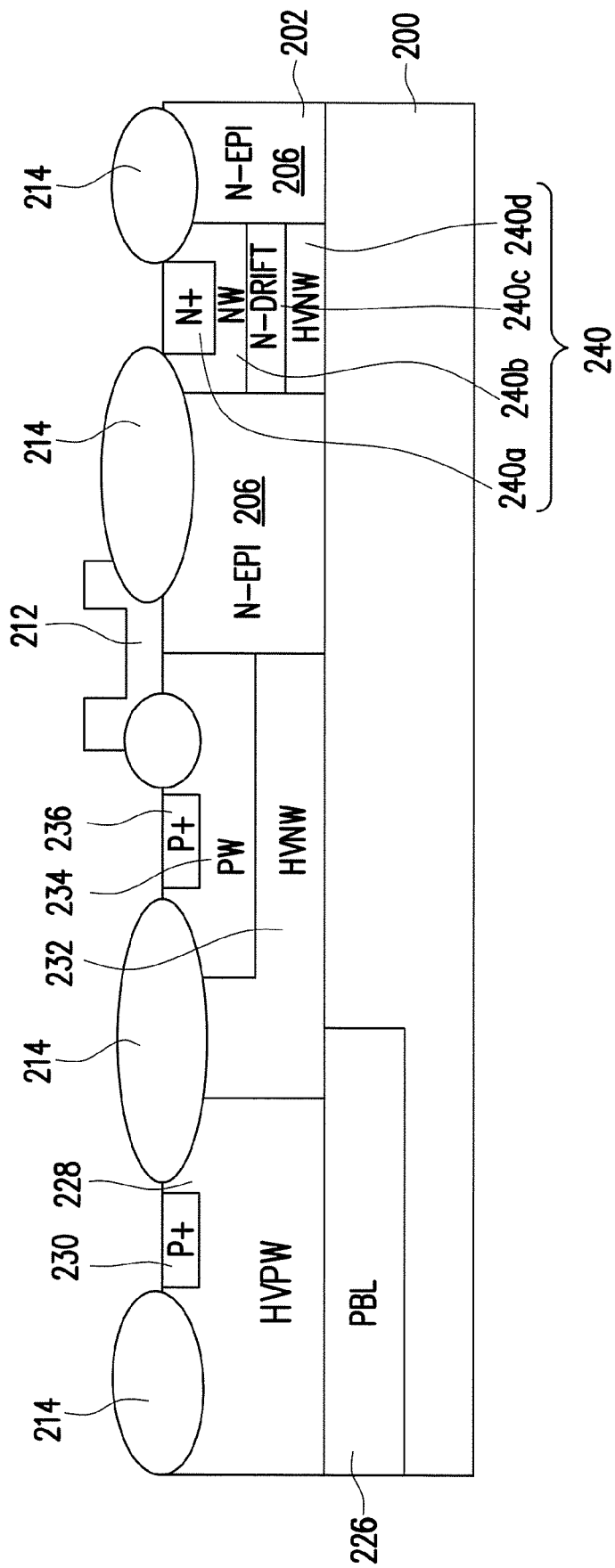
FIG. 5 is a drawing, schematically illustrating a cross-sectional structure of a HVJT structure, according to an embodiment of the invention.

In further embodiment, the HVJT structure can have further modification. FIG. 5 is a drawing, schematically illustrating a cross-sectional structure of a HVJT structure, according to an embodiment of the invention. Referring to FIG. 5, a P-type buried (PBL) layer 226 may be firstly formed in the P-type substrate 200 at surface. Then, the epitaxial layer 202 is formed on the substrate 200 to provide the base for various doped regions. Here, the P-type buried (PBL) layer 226 can provide the substrate voltage to the substrate 200 at the end.

In the embodiment, the structure with integration of the bootstrap diode is described, in which the PNP path as built up is taken to complete the structure. The same reference numerals represent the similar device elements as previously described. The structure of the PNP path in the embodiment includes the N-type high voltage well region 232, formed in the epitaxial layer 202, contacting with the substrate 200 and the P-type buried layer 226. The N-type high voltage well region 232 has a primary part contacts the substrate 200 and the contact area with the P-type buried layer (PBL) 226 is secondary. Then, the P-type doped well region (PW) 234 is formed in the N-type high voltage well region 232. The P-type contact region (P+) 236 is formed in the P-type doped well region (PW) 234, to connect with the anode. The gate structure 212 is on the N-type epitaxial doped region (N-EPI) 206 and also on the P-type doped well region (PW) 234. A structure of the PNP path can be formed from the substrate 200, the N-type high voltage well region 232, the P-type doped well region (PW) 234 and the P-type contact region (P+) 236. The P-type doped well region (PW) 234 and the N-type high voltage well region 232 can achieve the integration of the bootstrap diode. The N-type high voltage well region 232 also isolates the P-type contact region (P+) 236 from the substrate 200.

In addition, as to the P-type base doped structure for receiving the substrate voltage, in an example, it can include P+ doped region 230, P-type high voltage well region (HVPW) 228, and P-type buried layer (PBL) 226. The P+ doped region 230 receives the substrate voltage to provide for the substrate 200. As understandably, the previous embodiments can also be taken for the P-type base doped structure but the invention does not need to limit the P-type base doped structure.

In addition, as to an N-type cathode structure 240, it can take from the structures as described in foregoing embodiments. The embodiment as an example takes a similar structure of FIG. 4, including N-type high voltage well region (HVNW) 240d, in contact with the substrate. An N-type doped region 240c is on the N-type high voltage well region (HVNW) 240d. An N-type doped region (NW) 240b is on the N-type doped region 240c. An N-type contact region 240a is on the N-type doped region (NW) 240b, used to connect to the cathode.

Figure 6:
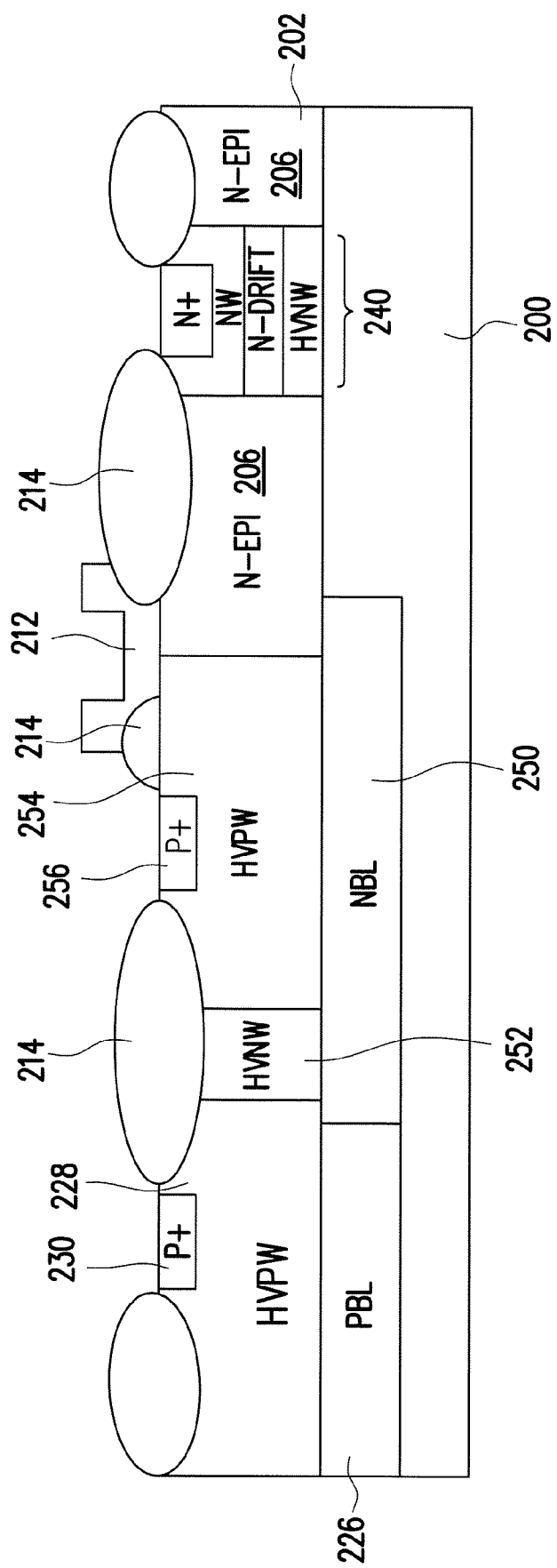
FIG. 6 is a drawing, schematically illustrating a cross-sectional structure of a HVJT structure, according to an embodiment of the invention.

FIG. 6 is a drawing, schematically illustrating a cross-sectional structure of a HVJT structure, according to an embodiment of the invention. Referring to FIG. 6, in a further embodiment of the invention, it is about the further modification on the structure of the PNP path as formed to integrate the bootstrap diode. The embodiment takes the structure in FIG. 5 as an example and further modifies the structure of the PNP path. An N-type buried layer (NBL) 250 is also formed in the substrate 200 at a surface layer, adjacent to the P-type buried layer (PBL) 226.

A P-type high voltage well region (HVPW) 254 is formed in the epitaxial layer 202 over the N-type buried layer (NBL) 250. A P-type contact region (P+) 256 is formed in the P-type high voltage well region (HVPW) 254, used to connect to the anode, such as the system voltage Vcc. Another N-type high voltage well region (HVNW) 252 is formed in the epitaxial layer 202, adjacent to the P-type high voltage well region (HVPW) 254, and contacting with the N-type buried layer (NBL) 250 but no need to contact with the P-type buried layer (PBL) 226. The N-type high voltage well region (HVNW) 252 is between the P-type high voltage well region (HVPW) 254 and the P-type base doped structure, which includes the P+ doped region 230, the P-type high voltage well region (HVPW) 228 and the P-type buried layer (PBL) 226. As a result, the PNP path integrating the bootstrap diode can be formed in the HVJT structure.

As to the foregoing descriptions, the invention in the HVJT structure has formed the structure of PNP path from the doped region for receiving the anode voltage to the substrate, wherein the integration of the bootstrap diode therein has also been achieved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A high voltage junction terminating (HVJT) structure, suitable for use in a high voltage integrated circuit (HVIC), wherein the HVIC includes a high-side circuit, a low-side circuit, and a level shifter connected between the high-side circuit and the low-side circuit for shifting power level, the HVJT structure comprising:
   a substrate of a P conductive type;
   an epitaxial layer, disposed on the substrate;
   an N-type doped structure, disposed in the epitaxial layer, contacting with the substrate;
   a P-type doped structure, disposed on the N-type doped structure, connecting with an anode, wherein the substrate, the N-type doped structure and the P-type doped structure form a PNP path along a perpendicular direction to the substrate, wherein the N-type doped structure and the P-type doped structure provide a bootstrap diode and surround the high-side circuit at a horizontal direction;
   an N-type cathode structure, disposed in the epitaxial layer, contacting with a cathode;
   an N-type epitaxial doped region, disposed in the epitaxial layer, contacting with the substrate between the PNP path and the N-type cathode structure, and surrounding the high-side circuit;
   a gate structure, disposed over the N-type epitaxial doped region, between the P-type doped structure and the N-type cathode structure; and
   a P-type base doped structure, disposed in a P-type doped well of the epitaxial layer adjacent to the N-type doped structure, to provide a substrate voltage to the substrate, wherein a structure of the PNP path comprises:
   a first N-type high voltage well region, in the epitaxial layer and contacting with the substrate;
   a P-type well region, in the first N-type high voltage well region, wherein the first N-type high voltage well region surrounds sidewalls of the P-type well region, wherein a first sidewall of the first N-type high voltage well region under the gate structure abuts to the N-type epitaxial doped region and a second sidewall of the first N-type high voltage well region directly contacts with the P-type doped well containing the P-type base doped structure; and
   a P-type contact region, in the P-type well region, to connect with the anode.

2. The HVJT structure of claim 1, wherein the N-type cathode structure comprises:
   a first N-type doped region in the N-type epitaxial doped region, without contacting with the substrate;
   a second N-type doped region in the first N-type doped region; and
   an N-type contact region, in the second N-type doped region, to connect with the cathode.

3. The HVJT structure of claim 1, wherein a bottom of the first N-type high voltage well region further comprises N-type buried layer in contacting with the substrate but having a distance from the P-type base doped structure.

4. The HVJT structure of claim 3, wherein the N-type cathode structure comprises:
   a first N-type doped region in the N-type epitaxial doped region, without contacting with the substrate;
   a second N-type doped region in the first N-type doped region; and
   an N-type contact region, in the second N-type doped region, to connect with the cathode.

5. The HVJT structure of claim 1, wherein the substrate has a P-type buried layer formed thereon, wherein a structure of the PNP path comprises:
   the first N-type high voltage well region, in the epitaxial layer and contacting with the substrate and the P-type buried layer;
   the P-type well region in the first N-type high voltage well region; and
   the P-type contact region, in the P-type well region to contact with the anode.

6. The HVJT structure of claim 1, wherein a structure of the PNP path comprises:
   an N-type buried layer, disposed in the substrate at surface;
   the P-type high voltage well region, in the epitaxial layer and contacting with the N-type buried layer;
   the P-type contact region, in the P-type high voltage well region, to connect with the anode; and
   the first N-type high voltage well region, in the epitaxial layer adjacent to the P-type high voltage well region and contacting with the N-type buried layer, wherein the first N-type high voltage well region is between the P-type high voltage well region and the P-type base doped structure.

7. The HVJT structure of claim 6, wherein the substrate also has a P-type buried layer formed thereon, adjacent to the N-type buried layer.

8. The HVJT structure of claim 1, wherein the P-type base doped structure comprises:
   a P-type buried layer, disposed in the substrate at surface;
   a P-type high voltage well region, adjacent to a structure of the PNP path; and
   a P-type doped region, in the P-type high voltage well region, to receive the substrate voltage.

9. The HVJT structure of claim 1, wherein a voltage of the anode varies with an operation state.

10. A high voltage integrated circuit, implemented on a substrate of a P conductive type, wherein the high voltage integrated circuit has a high-side circuit, a low-side circuit, and a level shifter connected between the high-side circuit and the low-side circuit for shifting power level, the high voltage integrated circuit comprises:
    a high voltage junction terminating structure, surrounding the high-side circuit, wherein the high voltage junction terminating structure has an anode, wherein from the anode to the substrate along a direction perpendicular to the substrate, a PNP doped structure is comprised, wherein a structure of the PNP path comprises:
    a first N-type high voltage well region, in an epitaxial layer and contacting with the substrate;
    a P-type well region, in the first N-type high voltage well region, wherein the first N-type high voltage well region surrounds sidewalls of the P-type well region, wherein a first sidewall of the first N-type high voltage well region abuts to an N-type doped portion of the epitaxial layer and a second sidewall of the first N-type high voltage well region directly contacts with a P-type doped portion of the epitaxial layer, wherein a P-type base doped structure is disposed in the P-type doped portion of the epitaxial layer; and
    a P-type contact region, in the P-type well region, to connect with the anode.

* * * * *